United States Patent
Liu

(10) Patent No.: US 6,468,915 B1
(45) Date of Patent: Oct. 22, 2002

(54) METHOD OF SILICON OXYNITRIDE ARC REMOVAL AFTER GATE ETCHING

(75) Inventor: Chi-Kang Liu, Ping-Zhenshi (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/666,317

(22) Filed: Sep. 21, 2000

(51) Int. Cl.$^7$ ............................................. H01L 21/302
(52) U.S. Cl. ..................... 438/706; 438/710; 438/712; 438/720
(58) Field of Search ................. 438/700, 706, 438/710, 713, 720, 745, 197, 303, 305, 585, 595

(56) References Cited

U.S. PATENT DOCUMENTS

| | | | | |
|---|---|---|---|---|
| 5,573,965 A | * | 11/1996 | Chen et al. ................. | 438/197 |
| 5,753,549 A | * | 5/1998 | Lee ............................. | 438/243 |
| 5,846,860 A | * | 12/1998 | Shih et al. .................. | 438/253 |
| 5,866,460 A | * | 2/1999 | Akram et al. ............... | 438/306 |
| 5,918,134 A | * | 6/1999 | Gardner et al. ............. | 438/305 |
| 5,933,729 A | | 8/1999 | Chan .......................... | 438/257 |
| 6,033,956 A | | 3/2000 | Wu ............................. | 438/261 |
| 6,171,910 B1 | * | 1/2001 | Hobbs et al. ............... | 438/275 |
| 6,221,704 B1 | * | 4/2001 | Furukawa et al. .......... | 438/197 |

* cited by examiner

*Primary Examiner*—Robert Kunemund
*Assistant Examiner*—Lan Vinh
(74) *Attorney, Agent, or Firm*—George O. Saile; Stephen B. Ackerman

(57) ABSTRACT

A method is taught for removing a silicon oxynitride ARC from over a polysilicon gate after the gate is patterned. The ARC is removed by wet etching without damaging or undercutting the polysilicon gate. This is accomplished by protecting the lateral sides of a polysilicon gate with a thin silicon oxide layer prior to the performing the wet etch. The method is primarily directed towards removal of a silicon oxynitride ARC layer from the upper surface of the polysilicon gate electrode in a salicide process, although a silicon nitride layer may also be removed by the same method. The protective silicon oxide is formed by rapid thermal oxidation in $O_2$ or by plasma oxidation in $O_2$ and $H_2O$. After oxidation, the ARC is removed with hot $H_3PO_4$. The protective silicon oxide protects the lateral surfaces of the polysilicon gate from attack by the acid. Following implantation of LDD regions, a conformal sidewall layer is deposited and the sidewalls formed in the conventional manner. When oxide/nitride sidewalls are formed, the protective oxide serves as a pad layer under the nitride. The method is particularly effective in preventing stress induced cracks in a composite oxide/nitride sidewall which has a foot. Elimination of gate undercutting by gate edge protection, according to the method described, eliminates excessive sidewall thickness in the vicinity of the corner at the foot and thereby minimizes stress in this region.

15 Claims, 6 Drawing Sheets

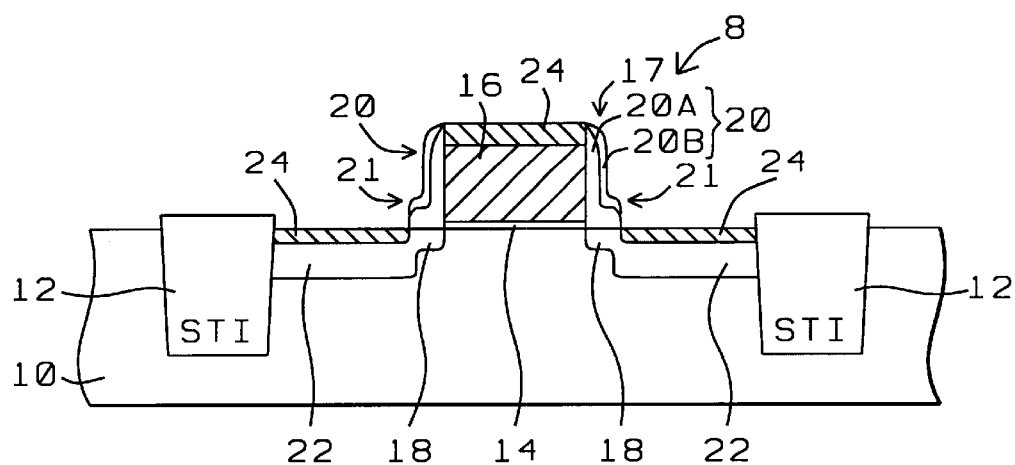
FIG. 1 - Prior Art
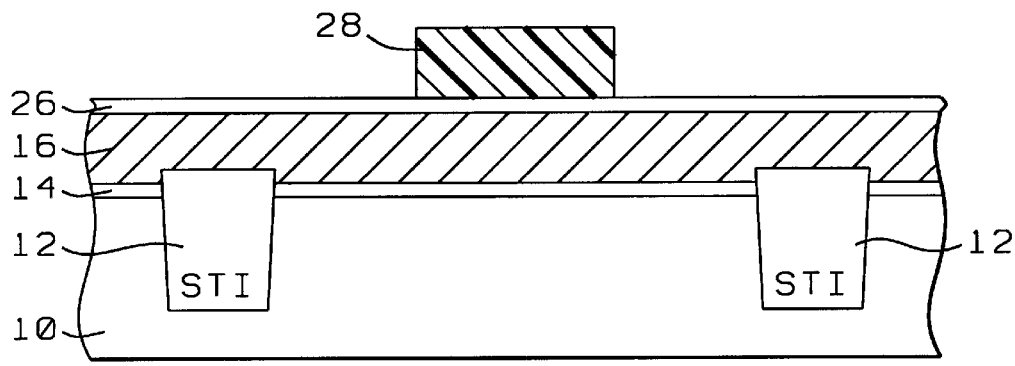
FIG. 2A
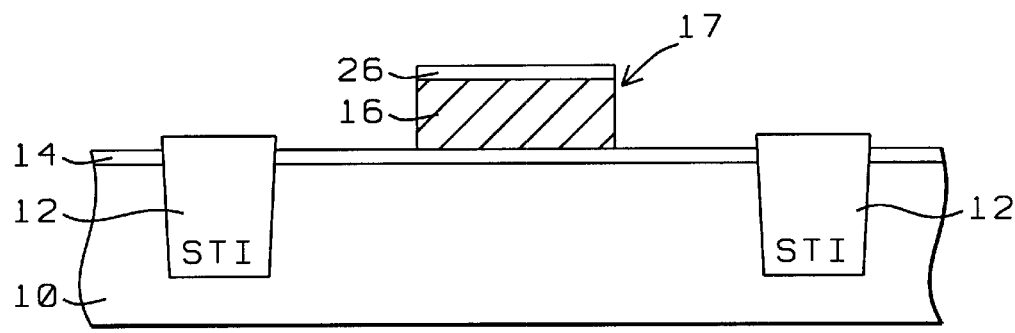
FIG. 2B

METHOD OF SILICON OXYNITRIDE ARC REMOVAL AFTER GATE ETCHING

BACKGROUND OF THE INVENTION (1) Field of the Invention

The invention relates to processes for the manufacture of semiconductor devices and more particularly to processes for forming self-aligned polysilicon gate field effect transistors.

(2) Background to the Invention and Description of Related Art

Complimentary metal oxide semiconductor(CMOS) field effect transistor(FET) technology involves the formation n-channel FETs(NMOS) and p-channel FETs(PMOS) in combination to form low current, high performance integrated circuits. The complimentary use of NMOS and PMOS devices, typically in the form of a basic inverter device, allows a considerable increase of circuit density of circuit elements by reduction of heat generation. The increase in device density accompanied by the shrinkage of device size has resulted in improved circuit performance and reliability as well as reduced cost. For these reasons CMOS integrated circuits have found widespread use, particularly in digital applications.

The basic MOSFET, whether it be NMOS or PMOS is typically formed by a self-aligned polysilicon gate process. In order to lower the conductivity of the polysilicon gate a transition metal is often alloyed into the upper surface of the polysilicon. The resultant laminar polysilicon/silicide structure is referred to as a polycide gate. Although there are several ways to form a polycide gate, a well known process which is particularly effective in sub-micron MOSFET technology, because of it's ability to form the silicide on the polysilicon gate while simultaneously forming high quality source/drain contacts, is the salicide (self-aligned silicide) process.

FIG. 1 shows a cross section of a familiar form of an n-channel, self-aligned polysilicon gate MOSFET (metal oxide silicon field effect transistor) 8 formed with STI (shallow trench isolation) 12 on a silicon wafer 10. The silicon oxide filled trenches form the field isolation around the device 8. The polysilicon gate electrode 17 is photolithographically patterned in a polysilicon layer 16 deposited over a thin gate oxide 14 using photoresist. The LDD (lightly doped drain) portions 18 of the source/drain elements are formed by ion implantation, using the gate 16 as a self-aligned mask. Composite sidewall spacers 21 are then formed which, along with the gate electrode 16, provide a mask for a second ion implantation by which the main portions 22 of the source/drain elements are formed. The sidewall 20 spacers consist of a silicon oxide portion 20A and a silicon nitride portion 20B and are formed with a foot 21 with the aid of an additional sacrificial oxide layer over the nitride which is no longer present in the figure. A refractory metal, for example cobalt or titanium, is deposited on the wafer and is reacted with the polysilicon gate and with the exposed source/drain region by an anneal to form a silicide. The un-reacted metal is removed by wet etching leaving the silicide 24 on the silicon surfaces. Selective formation of a silicide simultaneously on the polysilicon gate and source drain regions to form contact regions is the key characteristic of the salicide process.

Processing steps for forming the MOSFET 8, and which are relevant to the present invention are shown in detail in FIGS. 2A through 2D and will now be described. Referring to FIG. 2A, after the STI 12 is formed and a gate oxide 14 has been grown by thermal oxidation of the exposed silicon regions, a polysilicon gate layer 16 is deposited. The polysilicon gate layer 16 is then patterned with photoresist to form a gate electrode. In order to achieve high photolithographic resolution, it is necessary to deposit a thin anti-reflective coating (ARC) 26 over the gate layer 16 before the photoresist 28 is applied and patterned. The ARC 18 absorbs stray radiation reflected from the surface of the polysilicon gate layer during the photoresist patterning exposure, thereby eliminating unwanted exposure at the pattern edges and improving the crispness of the image. An often used ARC material is silicon oxynitride which is deposited on the gate layer 16 by LPCVD (low pressure chemical vapor deposition) to a thickness of a few hundred Angstroms. The photoresist 28 is then deposited and patterned to define a gate electrode. Referring, next to FIG. 2B, the exposed ARC 26 and the polysilicon gate layer 16 are etched by an anisotropic dry (plasma) etching technique, for example reactive ion etching (RIE), stopping in the gate oxide 14, thereby forming a gate electrode 17. The etchants used are selected to provide a high polysilicon-to-silicon oxide selectivity towards the end of the etching process so that the very thin gate oxide 14 is not penetrated and functions as an etch stop. In addition the gate oxide and the STI 12 must also endure an over etch period wherein and residual pockets of polysilicon are removed.

After the polysilicon gate electrode 17 has been patterned, residual photoresist 28 and protective sidewall polymer (not shown) which is formed on the polysilicon walls during etching, is removed either by ashing in an oxygen plasma or by the use of liquid strippers. It remains for the ARC layer 26 to be removed from the top of the polysilicon gate electrode 17.

A common method for removal of the silicon oxynitride ARC 26 is by dipping the wafer 10 into hot $H_3PO_4$ which easily removes the ARC without attacking the gate oxide 14. A problem with this method has been found by the present investigator in the formation of short channel MOSFETs, wherein the hot $H_3PO_4$ causes an undercutting 29 of the polysilicon gate electrode, which is shown in the cross section in FIG. 2C. This not only degrades the critical width dimension of the gate electrode but also causes stresses after LDD sidewalls are formed. Referring to FIG. 2D, the completed MOSFET 8 with the undercut gate electrode 17 is shown after composite footed sidewalls 20 and the salicide regions 24 have been formed. Stresses in the sidewalls 20, particularly at the point where the foot is joined, which is abnormally thick because of the concavity of the undercut 30, cause the formation of cracks 36 near the bottom corners of the gate electrode 17. The cracks 36 extend well into the silicon in the channel region, effectively destroying the device.

FIG. 3 is a drawing made from an SEM (scanning electron micrograph) showing a cross section of a polysilicon gate structure, made by a salicide process on a wafer 30, in which the oxynitride ARC was removed with hot $H_3PO_4$ directly after polysilicon gate patterning. The photo was made after suicides 31A and 31B were formed respectively on the polysilicon gate 37 and the source/drain surfaces The polysilicon gate 37, has been undercut 32 by an $H_3PO_4$ etch which was used to remove a silicon oxynitride ARC. Silicon nitride sidewalls 33 were formed with an underlying pad oxide 34 which acts as a stress buffer. The pad oxide 34 and the silicon nitride sidewall 33 were formed after ARC removal. After the silicide forming anneal, a crack 36 developed in the undercut region and propagated well into the silicon channel region, destroying the device. The crack 36 was caused by thermal stresses in the nitride sidewall in the region of the undercut 32. wherein the nitride/oxide sidewall not only has a corner portion but also is thicker because of the undercut 32. The condition of high thickness in combination with increased concavity, caused by the undercut, results in a high shearing stress in this region making it prone to crack.

It would therefore be advantageous to have a method for protecting the sidewall from attack during the $H_3PO_4$ oxynitride etch, thereby preventing the undercutting. This would result in a more favorable contour as well as reduced sidewall thickness in the corner region, and consequently lower stress and elimination of crack formation. The present invention provides such a method.

Chan, U.S. Pat. No. 5,933,729 reduces the height of a vertical ONO (oxide/nitride/oxide) fence along non-vertical polysilicon sidewalls by the use of a fluorocarbon plasma etch in the formation of a flash memory device. This prevents residual angled ONO fence from shielding a polysilicon patterning etch and leaving polysilicon stringers. Wu, U.S. Pat. No. 6,033,956 forms a thin oxynitride/oxide layer on a polysilicon gate electrode which remains on the structure as the floating gate dielectric. Shih, et.al., U.S. Pat. No. 5,846,860 discloses a polysilicon wordline patterning process wherein additional oxide or nitride sidewall spacers are provided to define a buried contact.

SUMMARY OF THE INVENTION

It is an object of this invention to provide a method for removal of a silicon oxynitride ARC over a patterned polysilicon gate without damage to the gate sidewalls.

It is another object of this invention to provide a method for preventing undercutting of a polysilicon gate electrode prior to sidewall deposition.

It is yet another object of this invention to provide a method for preventing crack formation in sidewall structures formed on polysilicon gates.

These objects are accomplished by covering the exposed lateral sides of the polysilicon gate electrode with a thin protective silicon oxide layer prior to the removal of the ARC layer from the upper surface of the gate electrode. The silicon oxide is formed by RTO (rapid thermal oxidation) $O_2$ or by plasma oxidation in $O_2$ and $H_2O$. After oxidation, the ARC is removed with hot $H_3PO_4$. The protective silicon oxide protects the lateral surfaces of the polysilicon gate from attack by the acid. Following implantation of the LDD regions, sidewalls formed. The method is particularly effective in preventing stress induced cracks in composite oxide/nitride sidewall which have feet and are more susceptible to stress induced cracks.

BRIEF DESCRIPTION OF THE DRAWINGS

FIG. 1 is a cross section of a self-aligned polysilicon gate MOSFET formed using a salicide process to enhance the conductivity of the gate electrode as well as the source/drain contacts.

FIG. 2A through FIG. 2D are cross sections illustrating processing steps for the formation a of a polysilicon gate by a salicide process wherein a silicon oxynitride ARC is removed with $H_3PO_4$ without sidewall protection and showing polysilicon undercutting with subsequent crack formation.

DESCRIPTION OF THE PREFERRED EMBODIMENTS

Figure 4A:
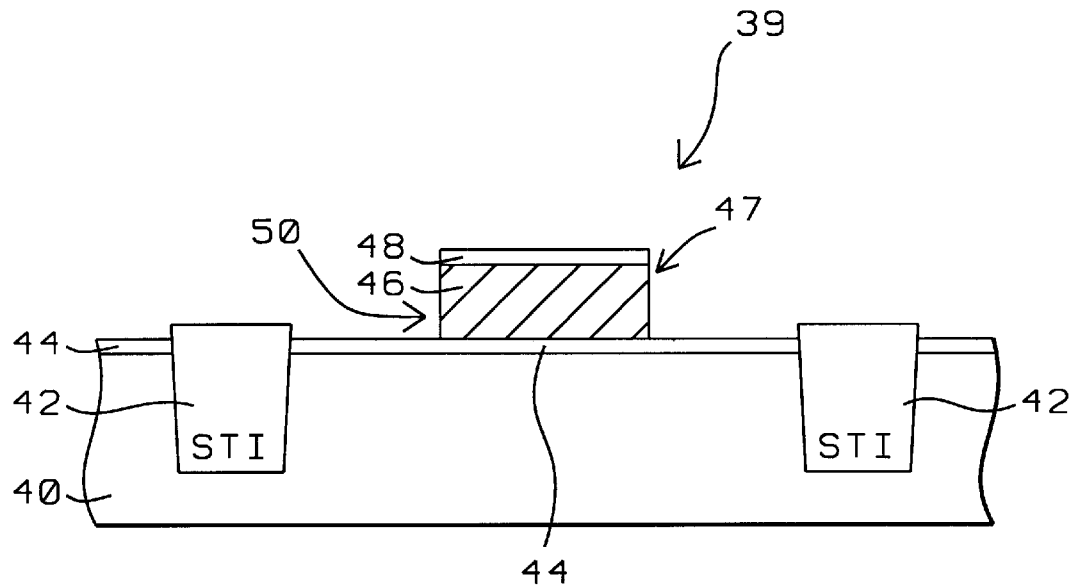
FIG. 4A through FIG. 4H are cross sections illustrating processing steps for the formation a of a polysilicon gate by a salicide process, in accordance with the present invention, wherein a silicon oxynitride ARC is removed with $H_3PO_4$ with sidewall protection.

In a preferred embodiment of this invention a p-type monocrystalline <100> oriented silicon wafer is provided. The first embodiment addresses the formation of a polysilicon gate electrode by a salicide process. Referring to FIG. 4A there is shown a cross section of an in-process self-aligned polysilicon gate MOSFET 39 on the silicon wafer 40 at a point in the process wherein a polysilicon gate electrode 47 has been patterned in a polysilicon layer 46 by anisotropic etching. The silicon wafer 40 has been provided with shallow trench field isolation (STI) 42 and a thin gate oxide 44 using conventional methods. Alternatively, the field isolation may be formed by the well known LOCOS (local oxidation of silicon) method. The polysilicon gate 47 has been patterned by DUV photolithography followed by anisotropic dry etching. The dry etching may be either reactive ion etching (RIE) or plasma etching. In RIE the wafer is positioned on the cathode of the etching tool. Plasma etching is accomplished with the wafer on the anode of a plasma etching tool. Both methods are well known by those in the art and are widely used. A silicon oxynitride ARC 48, used during the photolithography, is deposited by CVD and is between about 25 and 40 nm. (nanometers) thick. The gate oxide 44 is between about 2 and 5 nm. thick. The polysilicon gate 47 is between about 120 and 300 nm. thick and between about 100 and 300 nm. wide.

Figure 4B:
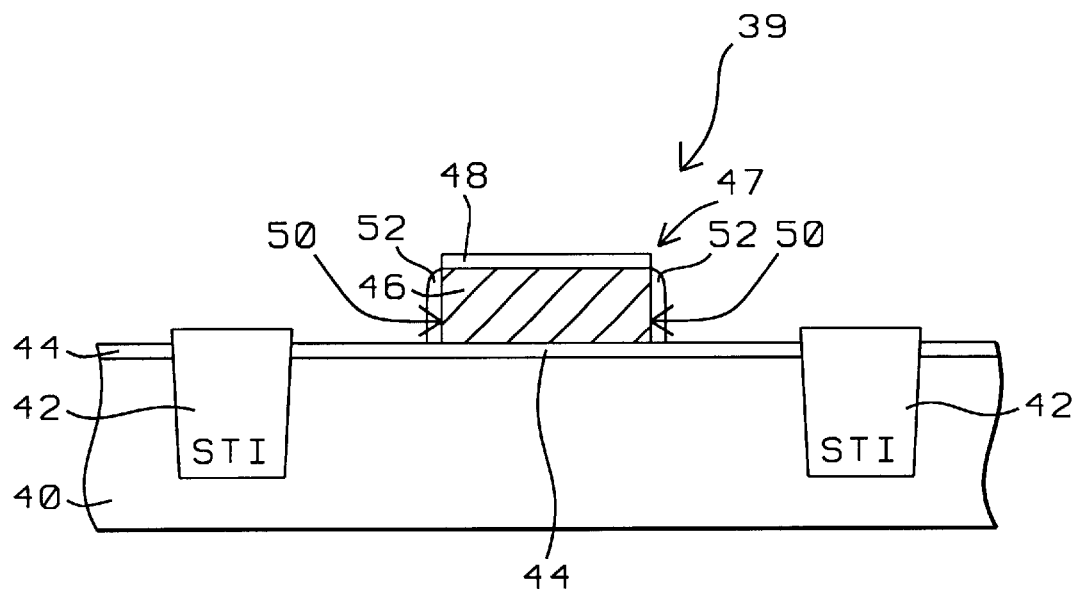

After the polysilicon gate 47 has been patterned by the anisotropic dry etching, it has straight and nearly vertical edges 50. Preferably the edges 50 have a slight (between about 4 and 10 degrees) positive taper. Referring to FIG. 4B, A protective oxide 52 is thermally grown on the polysilicon edges 50. The protective oxide is grown by RTO in a RTP (rapid thermal processing) chamber containing $O_2$ at a substrate temperature of between about 675 and 725° C. Alternatively, the oxidation may be performed by plasma oxidation in an $O_2/H_2O$ plasma with a substrate temperature of between about 225 and 275° C. The protective oxide 52A is grown on the exposed polysilicon edges 50 to a thickness of between about 1 and 2 nm. In the process, the thickness of the exposed gate oxide 44 (that portion of the gate oxide not covered by the gate 47) is further increased by about the same amount.

Figure 2C:
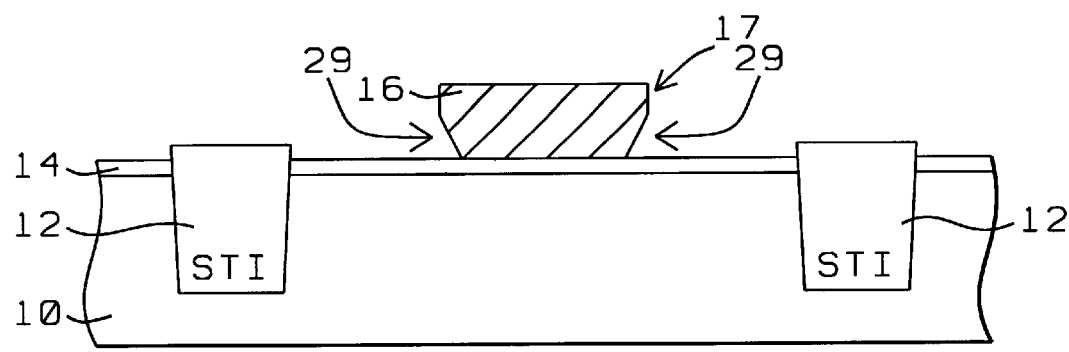
Figure 3:
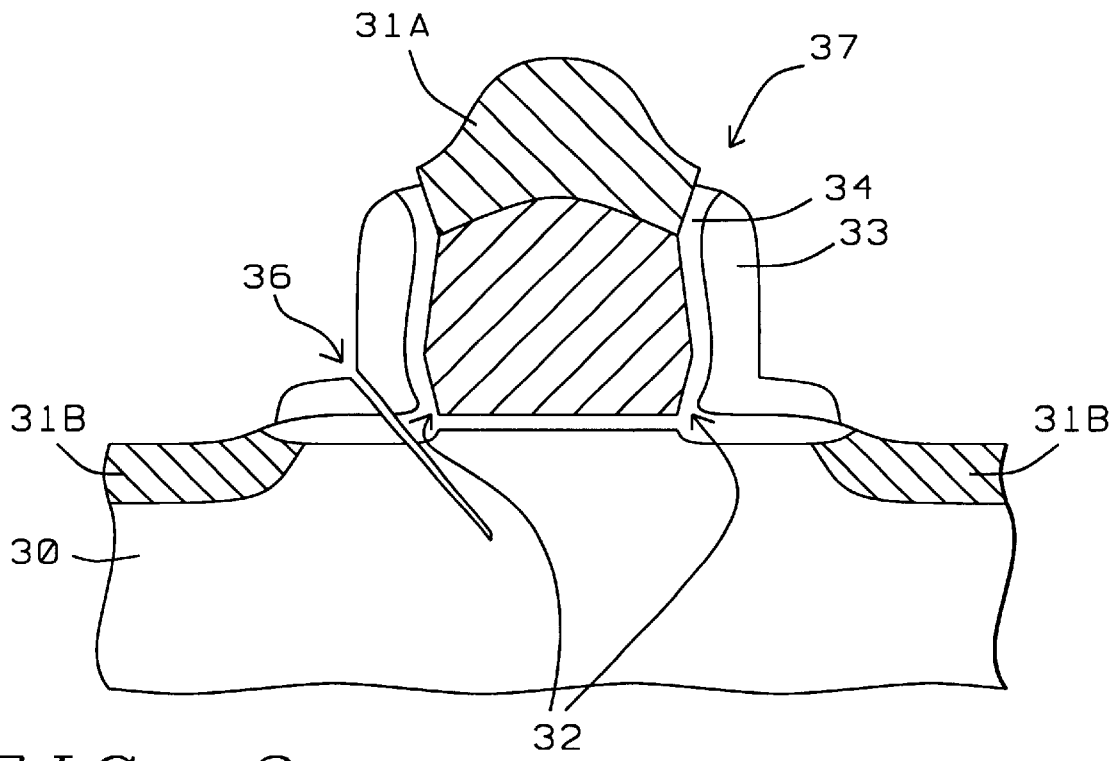
FIG. 3 is a drawing made from an SEM cross section of a self-aligned polysilicon gate MOSFET, showing a sidewall crack formed after silicidation.
Figure 4C:
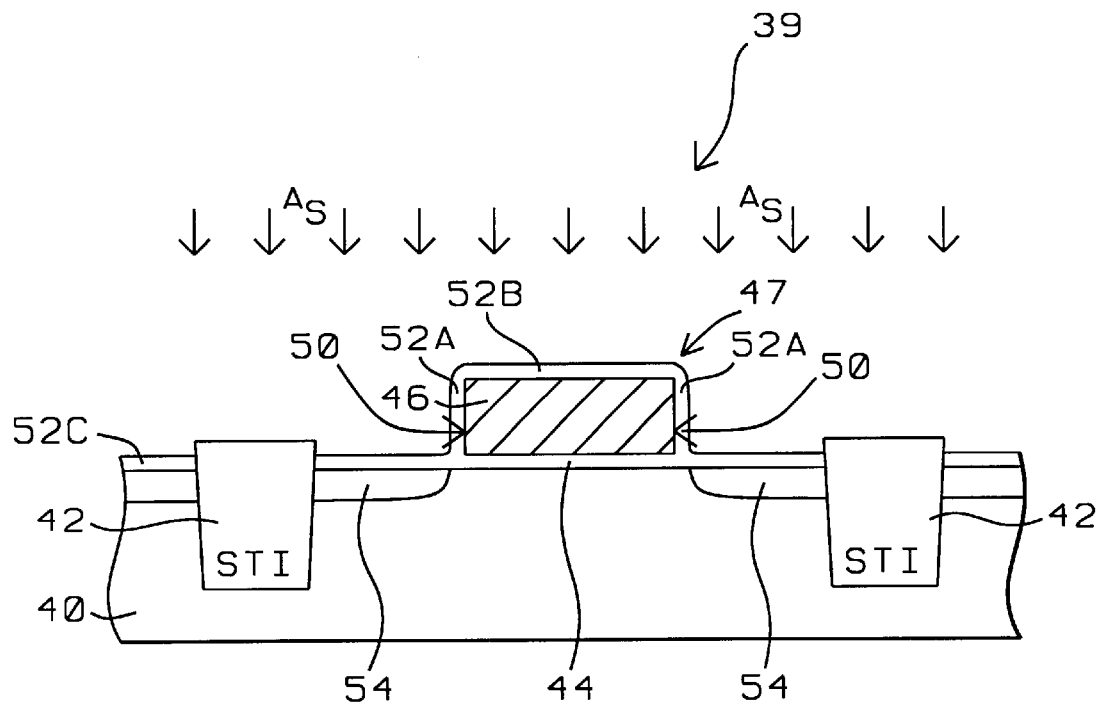

Next, the wafer 40 is dipped into 85% phosphoric acid heated to between about 170 and 190° C. The acid selectively removes the oxynitride ARC 48 while the oxide 52A protects the polysilicon edges 50 from attack. As a result, the polysilicon is not undercut. After the ARC 24 is removed, the wafer is rinsed and dried. Unlike the previously described method, wherein the polysilicon edge is not protected by an oxide, the polysilicon gate 47 is not undercut by the $H_3PO_4$ ARC removal etch, as was shown in FIGS. 2C, 2D, and in FIG. 3. Referring to FIG. 4C, a second oxidation then forms an oxide 52B between about 1 and 2 nm thick on the top surface of the polysilicon gate while increasing the original sidewall thickness 52A and the exposed gate oxide 52C about the same amount. The second oxidation is optional but preferable and is performed in the same manner as the one for forming the protective oxide 52A, The oxides 52A, 52B, and the exposed gate oxide layer 52C form a stress buffer under a next deposited silicon nitride layer from which the gate sidewall structures will later be formed.

LDD regions 54 are formed in the silicon active area by ion implantation of an n-type impurity such as arsenic or phosphorous. Procedures, including doses and implant energies for the formation of LDD regions are well known by those in the art. Note that the protective oxide 52A causes the LDD implantation to be offset outwardly from the edge 50 of the polysilicon gate 47 by the protective oxide 52A thickness. However, this relatively small offset can be either ignored because it is negligible or it can be accommodated for by design. After a later implantation anneal, the LDD edge will move laterally to under the polysilicon gate, but not as far as it would in the absence of the oxide 52A. It is therefore important, if the oxide 52A is to be left in place, that it's thickness be minimal and that the oxide thickness be considered in the design of the device.

After LDD ion implantation, a composite silicon oxide/silicon nitride sidewall structure is formed along the edges of the polysilicon gate 47. Preferably, the thin continuous oxide layer 44,52A,52B (now referred to and noted as 52 in the figures) is further oxidized to between about 100 and 150 nm. Increasing the thickness of the oxide layer 52, at this point, not only improves it's function as a nitride stress buffer but also permits the next deposited silicon nitride layer thickness to be reduced, thereby reducing the thermal budget. The additional oxidation is preferably accomplished either by RTO or by ISSG (in-situ stream generation).

Figure 4D:
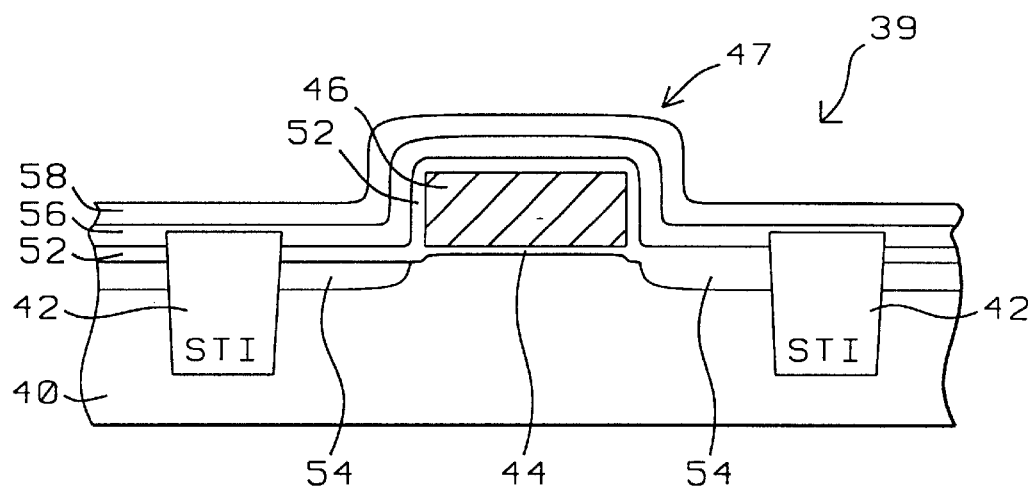

Referring to FIG. 4D, a conformal silicon nitride layer 56 is deposited on over the oxide layer 52 by a CVD method, preferably by PECVD (plasma enhanced chemical vapor deposition). The oxide layer 52, serves as a pad oxide under the nitride layer 56. The silicon nitride layer is deposited to a thickness of between about 20 and 30 nm. Parameters and chemistries for depositing silicon nitride layers by PECVD are well known in the art.

Figure 4E:
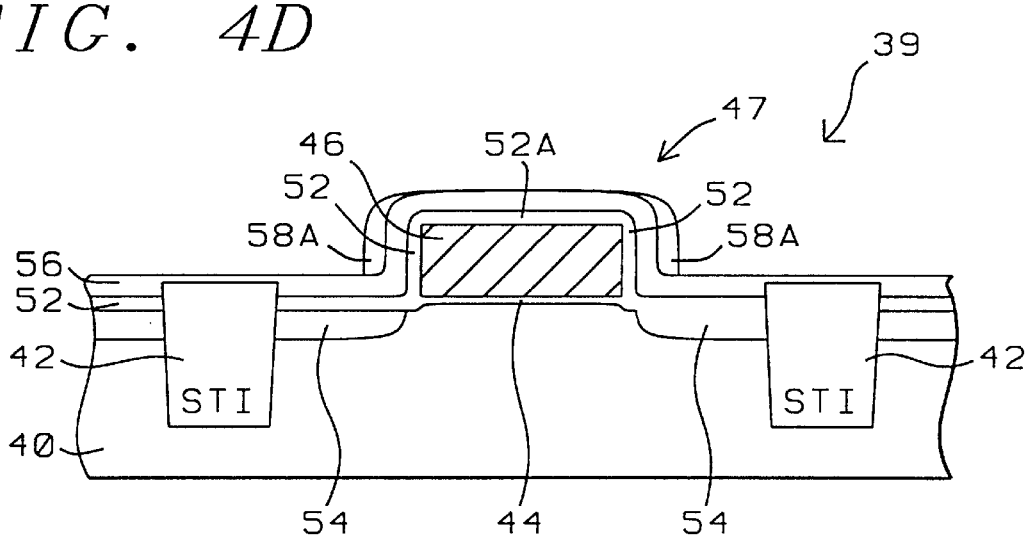
Figure 4F:
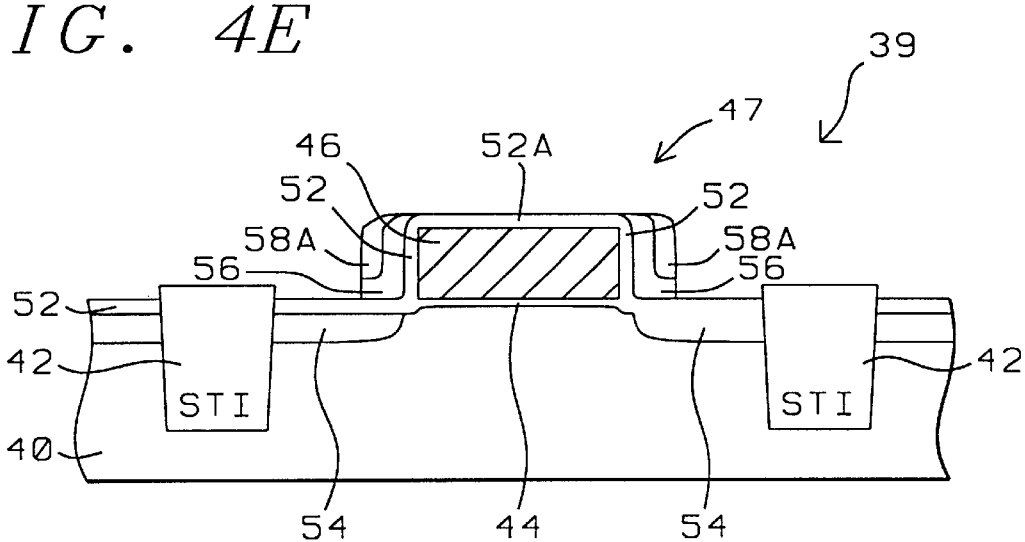
Figure 4G:
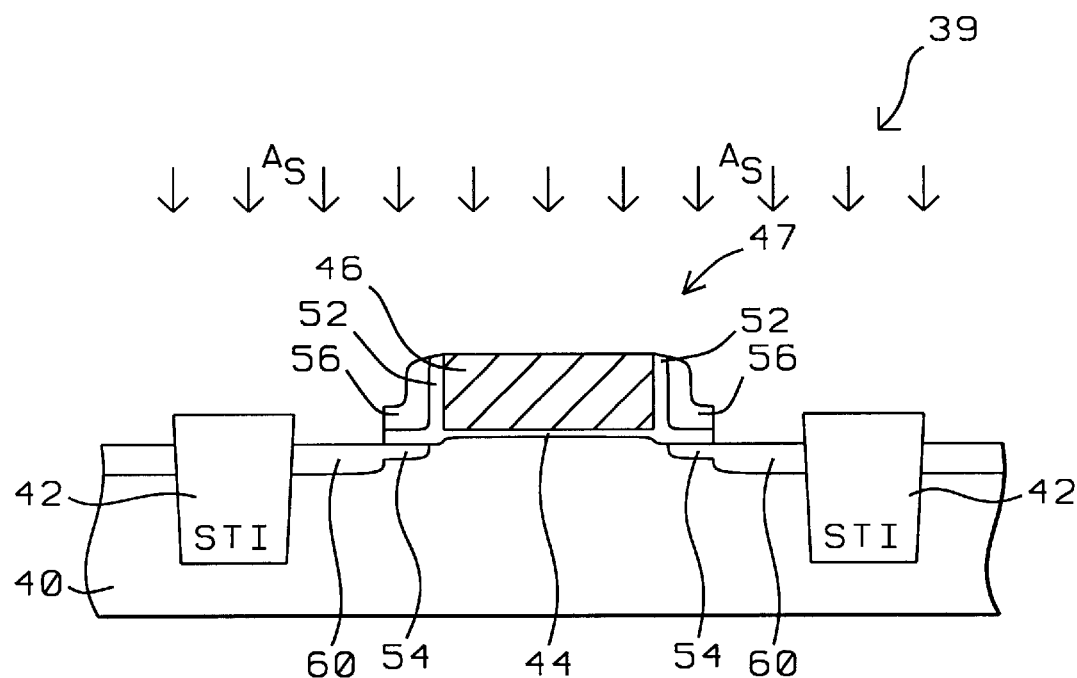
Figure 4H:
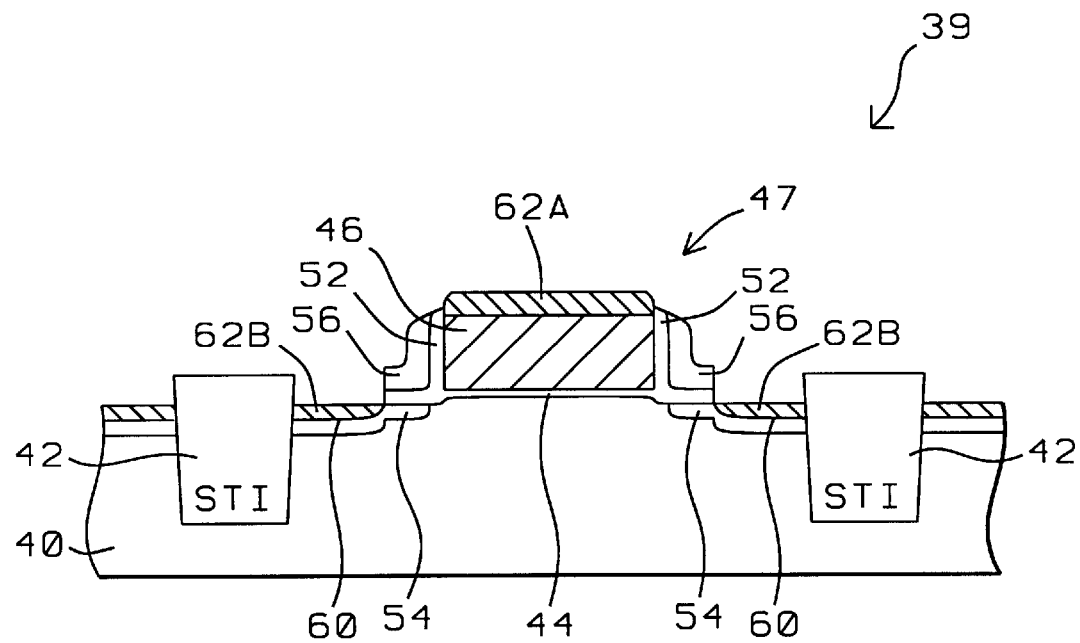

A sacrificial silicon oxide layer 58 is then deposited over the silicon nitride layer 56, preferably by a CVD method such as PECVD. The thickness of the oxide layer 58 determines the length of the sidewall foot which is formed by a series of etches. Referring to FIG. 4E, the sacrificial silicon oxide layer 58 is anisotropically etched by RIE, stopping on the nitride layer 56. An etchant chemistry which affords a high oxide/nitride etch rate selectivity is used. Etchant gases mixtures containing fluorocarbons such as $CHF_3$, $C_4F_8$, $CH_2F_2$ or $CH_2F_6$ or combinations thereof are known to give high oxide/nitride selectivities. When the nitride layer 56 is exposed, as determined by end point detection, residual sidewall portions 58A remain along the vertical walls of the gate structure. The RIE chemistry and operating conditions are then changed to preferably etch silicon nitride over silicon oxide. An etchant gas containing $NF_3$ may be used to afford a high nitride-to-oxide selectivity. Certain fluorocarbon/oxygen mixtures are also known to preferably etch silicon nitride over silicon oxide. The nitride layer 56 is anisotropically etched by RIE, stopping in the oxide layer 52 as shown in FIG. 4F. The residual sacrificial oxide 58A and the exposed portions of the oxide layer 52 are next removed by a dip etch in dilute aqueous HF, leaving the footed composite nitride/oxide sidewall structure shown in FIG. 4G.

A second ion implantation with an n-type impurity, for example arsenic, is next applied to form the main source/drain regions 60. The implantation also increases the doping level of the upper portion of the polysilicon gate electrode 47.

Figure 2D:
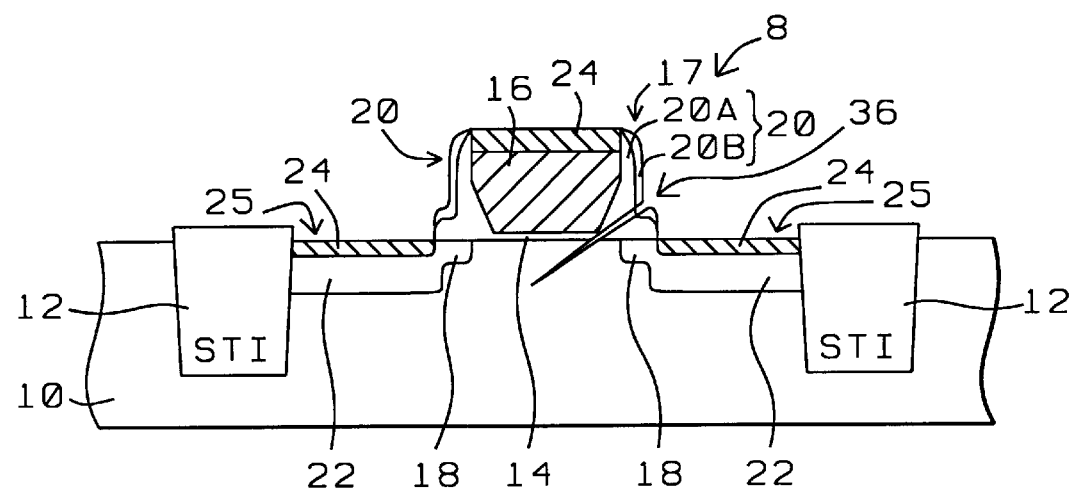

Silicide is next formed selectively on the exposed silicon of the source/drain regions 60 and over the entire length of the polysilicon gate 47, the upper surface of which, now lies exposed. This is accomplished by first depositing a blanket layer of cobalt on the wafer by sputtering. After the cobalt layer is deposited, a layer of metal nitride may alternately be deposited over the cobalt layer without breaking vacuum in order to prevent oxidation of the cobalt layer when exposed to atmosphere. Alternately, another refractory metal such as titanium, tantalum, or tungsten may be used in place of the cobalt layer, whereupon titanium silicide, tantalum silicide or tungsten silicide will thereafter be formed on the exposed silicon surfaces. The wafer is then annealed at elevated temperature, preferably by RTP in nitrogen, whereby the cobalt in contact with the silicon reacts to form cobalt silicide. After the annealing, the metal nitride and residual un-reacted cobalt are removed by wet etching in $NH_4OH$ and $H_2O_2$, leaving a $CoSi_2$ layer 62A on the polysilicon gate 47 and $CoSi_2$ regions 62B on the source/drain regions 560. Process parameters and procedures for forming silicide regions in this manner are well known in the art and, any conventional variation of this selective method may also be used here. Sidewall cracks 36 as shown in FIGS. 2D and 3 do not occur during the annealing nor do they form during any later processing.

The MOSFET 39 is now complete and is ready to be further processed by the formation of interconnective wiring levels which access the source, drain, and gate elements through contacts made to the silicide segments 62A and 62B.

While this invention has been particularly shown and described with reference to the preferred embodiment thereof, it will be understood by those skilled in the art that various changes in form and details may be made without departing from the spirit and scope of the invention.

The composite sidewall structure with the foot is much more prone to crack formation than the conventional sidewall which does not have a foot. Nevertheless, the sidewall stresses in conventional sidewall structures can be reduced by the eliminating the polysilicon undercut according to the method of the invention. Thus while sidewall cracking might not be observed in conventional sidewall structures, the stress lowering achieved by eliminating polysilicon undercutting can result in benefits to device performance such as reduced leakage currents.

While the embodiment of this invention utilize a p-type silicon substrate, an n-type silicon substrate could also be used without departing from the concepts therein provided. Although the disclosed method is particularly useful for a salicide process with silicon nitride sidewalls, it may also be applied to any process wherein an oxynitride ARC must be removed from a patterned polysilicon gate electrode, regardless of the nature of the material used for the sidewalls.

In addition while the embodiment is directed towards the removal of a silicon oxynitride ARC from over a polysilicon layer, the method will be equally effective for protecting exposed polysilicon edges during the removal of another material which may be selectively etched with hot $H_3PO_4$, for example, silicon nitride.

What is claimed is:

1. A method for removing a nitride from over a just patterned nitride over polysilicon laminar layer comprising:
   (a) providing a wafer having a laminar layer comprising a nitride layer over a polysilicon layer;
   (b) patterning said laminar layer, thereby exposing lateral surfaces of said polysilicon layer;
   (c) directly after said patterning, oxidizing said lateral surfaces thereby forming a protective oxide between about 1 and 2 nm. thick thereon; and (d) removing said nitride layer by wet etching, whereby said lateral surfaces of said polysilicon layer are, protected from attack by said wet etching.

2. The method of claim 1 wherein said nitride layer is selected from the group consisting of silicon nitride and silicon oxynitride.

3. The method of claim 1 wherein said nitride layer is between about 25 and 40 nm. thick.

4. The method of claim 1 wherein said polysilicon layer is between about 120 and 300 nm. thick.

5. The method of claim 1 wherein said patterning is accomplished by anisotropic dry etching.

6. The method of claim 1 wherein said protective oxide is formed by rapid thermal oxidation at a temperature of between about 675 and 725° C. in an ambient containing $O_2$.

7. The method of claim 1 wherein said protective oxide is formed by rapid thermal oxidation at a temperature of between about 225 and 275° C. in a plasma containing $O_2$ and $H_2O$.

8. The method of claim 1 wherein said wet etching is accomplished in $H_3PO_4$ at a temperature between about 170 and 190° C.

9. A method for forming a self-aligned polysilicon gate MOSFET comprising:

(a) providing a silicon wafer of a first conductivity type;

(b) forming a field oxide isolation on said silicon wafer surrounding and defining a device region;

(c) forming a gate oxide on said wafer;

(d) depositing a polysilicon layer on said wafer;

(e) depositing a silicon oxynitride ARC on said polysilicon layer;

(f) depositing and patterning a photoresist layer on said ARC to define a gate electrode;

(g) anisotropically etching said ARC and said polysilicon layer thereby forming a gate electrode with exposed lateral edges;

(h) directly after said etching, oxidizing said lateral edges thereby forming a protective silicon oxide between about 1 and 2 nm. thick thereon;

(i) removing said ARC by wet etching whereby said lateral edges are shielded from attack by said wet etching by said protective oxide;

(j) forming LDD regions by implanting ions of a second conductivity type;

(k) forming a sidewall structure adjacent to said gate electrode;

(l) forming source/drain regions by implanting ions of said second conductivity type; and (m) selectively forming a silicide on said source/drain regions and on said polysilicon gate, thereby forming a MOSFET.

10. The method of claim 9 wherein said ARC is between about 25 and 40 nm. thick.

11. The method of claim 9 wherein said polysilicon layer is between about 120 and 300 nm. thick.

12. The method of claim 9 wherein said anisotropic etching is selected from the group consisting of reactive ion etching and plasma etching.

13. The method of claim 9 wherein said protective silicon oxide and is formed by rapid thermal oxidation at a temperature of between about 675 and 725° C. in an ambient containing $O_2$.

14. The method of claim 9 wherein said protective silicon oxide and is formed by rapid thermal oxidation at a temperature of between about 225 and 275° C. in a plasma containing $O_2$ and $H_2O$.

15. The method of claim 9 wherein said wet etching is accomplished in $H_3PO_4$ at a temperature between about 170 and 190° C.

* * * * *